(12) United States Patent
Chu (10) Patent No.: US 11,431,601 B2
(45) Date of Patent: Aug. 30, 2022

(54) SYSTEM AND METHODS FOR PROVIDING WAVEFORMS OVER WIRELESS SYSTEMS FROM POWER MONITORS

(71) Applicant: VERDIGRIS TECHNOLOGIES, INC., Mountain View, CA (US)

(72) Inventor: Jonathan Chu, Mountain View, CA (US)

(73) Assignee: VERDIGRIS TECHNOLOGIES, INC., Mountain View, CA (US)

( * ) Notice: Subject to any disclaimer, the term of this patent is extended or adjusted under 35 U.S.C. 154(b) by 182 days.

(21) Appl. No.: 16/635,974

(22) PCT Filed: Aug. 9, 2018

(86) PCT No.: PCT/US2018/046135
§ 371 (c)(1),
(2) Date: Jan. 31, 2020

(87) PCT Pub. No.: WO2019/032914
PCT Pub. Date: Feb. 14, 2019

(65) Prior Publication Data
US 2021/0144077 A1 May 13, 2021

Related U.S. Application Data

(60) Provisional application No. 62/543,312, filed on Aug. 9, 2017.

(51) Int. Cl.
*H04L 43/10* (2022.01)
*H04W 4/38* (2018.01)
(Continued)

(52) U.S. Cl.
CPC ............ *H04L 43/10* (2013.01); *G01R 21/133* (2013.01); *G06Q 50/06* (2013.01); *H04L 12/10* (2013.01); *H04W 4/38* (2018.02)

(58) Field of Classification Search
CPC .......... H04W 4/38; H04L 43/10; H04L 12/10; G06Q 50/06; G01R 21/133
(Continued)

(56) References Cited

U.S. PATENT DOCUMENTS 9,678,120 B2  6/2017 Song et al.
2006/0212239 A1  9/2006 Letts et al.
(Continued)

FOREIGN PATENT DOCUMENTS

CN  1808132 A  7/2006
CN  101393234 A  3/2009
(Continued)

OTHER PUBLICATIONS

International Search Report for related International Application No. PCT/US2018/046135, dated Nov. 26, 2018 (3 pages).
(Continued)

*Primary Examiner* — John H Le
(74) *Attorney, Agent, or Firm* — Procopio, Cory, Hargreaves & Savitch LLP (57) ABSTRACT

A method of monitoring power systems over a wireless network protocol. The method includes receiving input waveform data containing a power event, capturing a pair of windows of the waveform data proximate to the power event, determining a hash for each of the pairs of window of waveform data, comparing each determined hash of each of the pair of windows to a library of hashes of previously encountered events, and based on the comparison of each determined hash of each pair of windows, transmitting the raw waveform of at least one of the pair windows over the wireless network protocol to an event detection system.

20 Claims, 5 Drawing Sheets

(51) Int. Cl.
 *G01R 21/133* (2006.01)
 *G06Q 50/06* (2012.01)
 *H04L 12/10* (2006.01)

(58) Field of Classification Search
 USPC .......................................................... 702/66
 See application file for complete search history.

(56) References Cited

U.S. PATENT DOCUMENTS

| | | | |
|---|---|---|---|
| 2011/0112779 A1* | 5/2011 | Tse ..................... | G06F 17/148 702/60 |
| 2013/0191103 A1 | 7/2013 | Chu et al. | |
| 2014/0347077 A1 | 11/2014 | Donaldson et al. | |
| 2015/0070953 A1 | 3/2015 | Colbeck | |
| 2015/0276825 A1* | 10/2015 | Curt ................... | G06F 11/3058 702/58 |
| 2015/0311923 A1 | 10/2015 | Valliappan et al. | |
| 2016/0080840 A1 | 3/2016 | Haghighat-Kashani et al. | |
| 2016/0132032 A1 | 5/2016 | Bruneel et al. | |
| 2021/0176073 A1* | 6/2021 | Spanier ............... | H04L 9/3236 |

FOREIGN PATENT DOCUMENTS

| | | |
|---|---|---|
| CN | 101809452 A | 8/2010 |
| CN | 101833442 A | 9/2010 |
| CN | 102016607 A | 4/2011 |
| CN | 102147807 A | 8/2011 |
| CN | 102216735 A | 10/2011 |
| CN | 103973761 A | 8/2014 |
| CN | 103988096 A | 8/2014 |
| CN | 104316844 A | 1/2015 |
| CN | 105976266 A | 9/2016 |
| CN | 106464988 A | 2/2017 |
| CN | 106537161 A | 3/2017 |
| CN | 106646127 A | 5/2017 |
| JP | 2013150508 A | 8/2013 |
| JP | 2014187795 A | 10/2014 |
| TW | 200839255 A | 10/2008 |
| WO | 9110303 A1 | 7/1991 |

OTHER PUBLICATIONS

Written Opinion for related International Application No. PCT/US2018/046135, dated Nov. 26, 2018 (9 pages).
International Preliminary Report on Patentability for related International Application No. PCT/US2018/046135, dated Feb. 20, 2020 (10 pages).
Office Action for related Chinese Patent Application No. 202010153010.4, dated Dec. 30, 2020; English abstract provided (14 pages).
China National Intellectual Property Administration, Notification to Go Through Formalities of Registration, Application No. 202010153010.4, dated Mar. 3, 2022, in 11 pages.

* cited by examiner

FIG. 1

| Waveform Hash | Waveform |
|---|---|
| HASH1 | WAVE1 |
| HASH2 | WAVE2 |
| HASH3 | WAVE3 |
| ... | ... |

SYSTEM AND METHODS FOR PROVIDING WAVEFORMS OVER WIRELESS SYSTEMS FROM POWER MONITORS

BACKGROUND

Field

The present disclosure relates to power systems, and more specifically, to systems and methods for transmission of waveforms over wireless systems such as Long Term Evolution (LTE).

Related Art

In related art implementations, smart meters record consumption of electrical energy, and are rapidly replacing traditional electromechanical meters such as interval or time-of-use meters. Smart meters are attractive to various customer classes (residential, commercial, and industrial) because they can provide features that traditional electricity meters cannot, such as automatic meter reading, real-time or near real-time sensors, power outage notification, remote reporting, and power quality monitoring. In addition, smart meters can communicate information about energy consumption in a two-way wireless communication between the meter and the electric company, thereby facilitating both monitoring and billing. The typical smart meter is limited, however, in that it is designed to calculate only the power consumption (wattage) for an entire structure.

In related art implementations, smart meters generate voltage and power readings that are recorded as waveforms to be streamed to data processing systems. Such waveforms may also carry information regarding events, which can alert the data processing systems of anomalies or other issues with the monitored power system.

SUMMARY

With recent developments in wireless transmission systems such as LTE, it has been possible for smart meters to transmit data wirelessly. However, the costs of bandwidth of such wireless systems are more expensive in comparison to their wired counterparts. In particular, the waveforms recorded by the smart meters may be cost prohibitive to transmit wirelessly over systems such as LTE.

Example implementations described herein are directed to a waveform processing and transmission system that utilizes wireless transmissions in an efficient manner so that waveforms recorded by the smart meter can be transmitted to the data processing systems in a cost effective manner.

DETAILED DESCRIPTION

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

Figure 1:
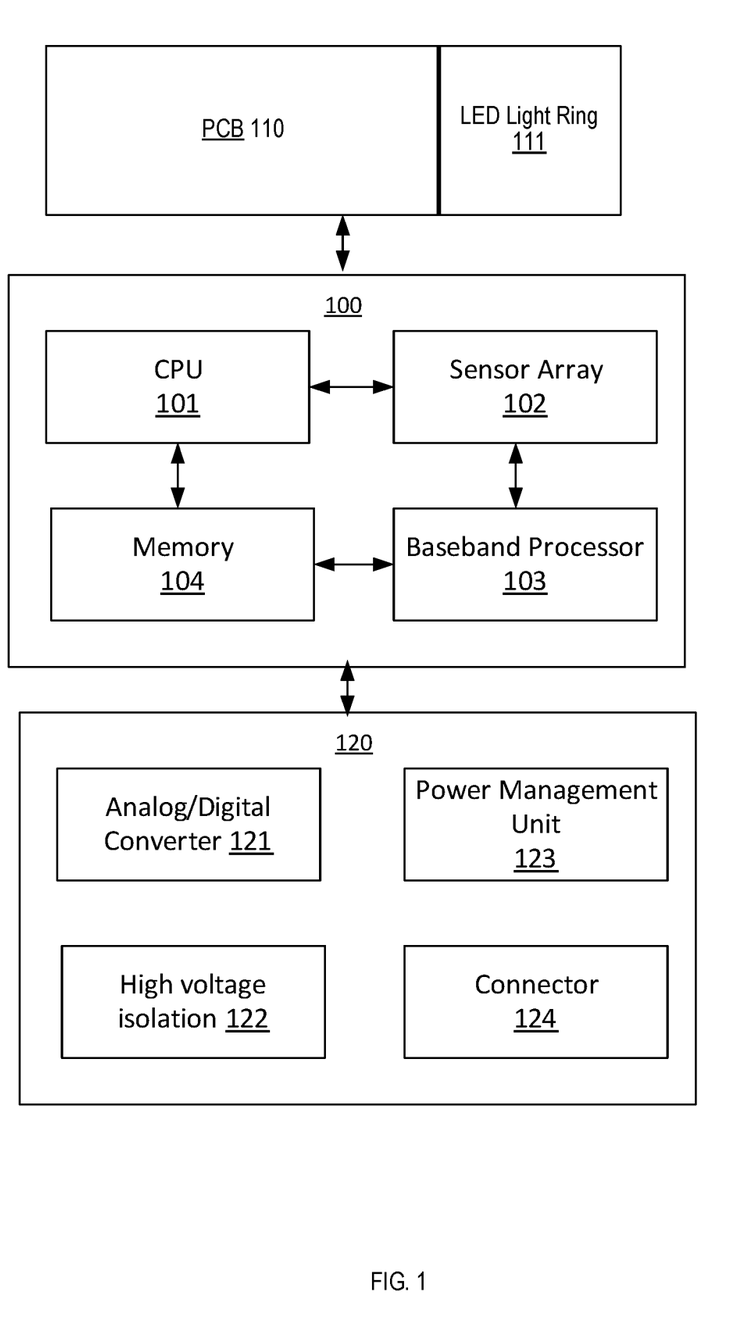
FIG. 1 illustrates an example diagram of a smart meter, in accordance with an example implementation.

FIG. 1 illustrates an energy monitor in accordance with an example implementation. Energy monitor may have a square shaped form factor, and can include a communications/digital layer 100 that involves a CPU 101, memory 101, sensor array 102, baseband processor 103, and memory 104. Data from the second level 120 of the energy monitor is sent to signal processor 102 in the form of digital signals, which is streamed to memory 101 and processed by CPU 100 to be prepared in a format for use by a receiving apparatus such as a power monitoring system. Processed data is then transmitted to the receiving apparatus by baseband processor 103, which can be implemented as streaming data or batch data over a wireless protocol such as LTE. The data received from the signal processor 102 can include frequency, voltage, and power data, reported at a fixed sample rate, such as 60 Hertz (Hz). In some implementations, current data may alternatively be reported and power data calculated based on the received voltage and current data. The data may be historical, streaming, or both.

The communications/digital layer 100 is connected to a Printed circuit board (PCB) 110 which an also involve an LED light ring 111 configured to activate LEDs depending on different signals received and statuses obtained from the communications/digital layer 100.

The second level 120 can involve an analog signal system that is configured to provide digital signals to the communication/digital layer 100 via an analog/digital converter 121. The second level 120 includes high voltage isolation 122 that isolates the high voltage from the rest of the energy monitor, a power management unit 123 that is configured to receive voltage measurements and other measurements from the power lines/power grid/power system. Connector 124 is a connector port for a sensor array connected to the power lines/power grid/power system that may take the form of an HDMI connector port.

Example implementations take advantage of the operating environment of the smart meters in that most of the recorded waveforms tend to fall within a variation of expected operating parameters. As such, there is a possibility of representing the expected waveforms in a dictionary form based on certain parameters of the waveforms (e.g., mean, variance, etc.). Example implementations can utilize a linear solver to compare waveforms to the dictionary, and then sends the dictionary entry over LTE in a streaming manner to the data processing system.

Figure 2:
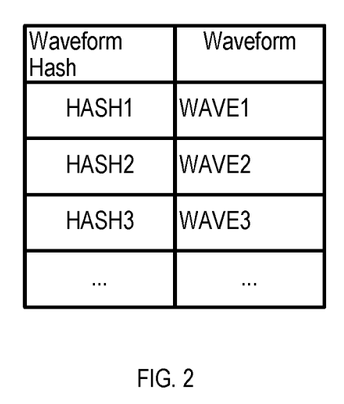
FIG. 2 illustrates an example of management information for the waveform dictionary, in accordance with an example implementation.

FIG. 2 illustrates an example of management information for the waveform dictionary, in accordance with an example implementation. In example implementations, various waveforms that are expected to be received by the energy monitor are associated with a hash. The information of FIG. 2 can be stored in the memory 10 of the energy monitor.

Figure 3:
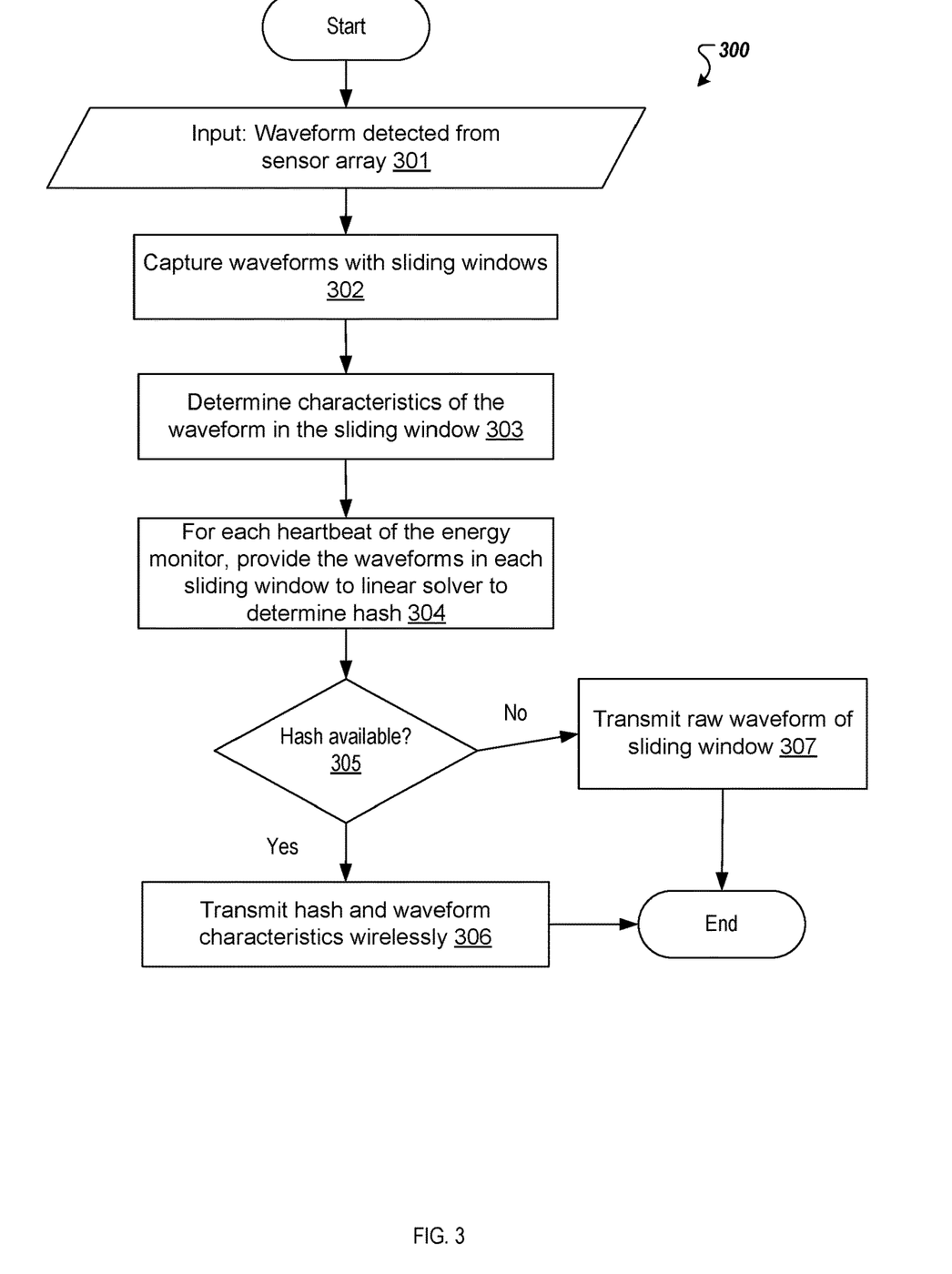
FIG. 3 illustrates a flow diagram in accordance with an example implementation.

FIG. 3 illustrates a flow diagram in accordance with an example implementation. At 301, the energy monitor receives input from the sensor array 102 in the form of waveforms (e.g., power, frequency, voltage). For example, the input may be an 8 kilohertz raw ADC output. At 302, the waveforms of an event are captured with sliding windows. This event may be representative of a statistical change in the operation behavior of the ADC out. The length of the sliding windows can be adjusted in accordance with the desired implementation.

At 303, characteristics are extracted from each sliding window (e.g., mean, variance, etc.). In other words, at 303, types of characteristics of the sliding windows are determined so that the sliding windows can be compared. At 304, for each heartbeat of the energy monitor, the sliding windows are processed by a linear solver to determine the appropriate hash for the waveform based on the management information of FIG. 2. In other words, as the process transitions to 304, a heartbeat is added when an event is determined to have happened. These heartbeats will be used to generate a folded statistical sample of all the waveforms that have been captured in the time up until that event and package that sample of the waveforms into one waveform model description, which is a means standard deviation of the given waveform.

The sliding windows are basically two windows that are capturing waveforms that are separated by some space on and are folding their own statistical models, (e.g., a leading and trailing window of the event). The leading and trailing windows are kind of compared against each other and when those two comparisons miss-match for a set amount of time (e.g., an extended duration), then the statistical difference between what's happened now and what happened in the immediate past, is the event detection that triggers this waveform generation at 304.

This process describes the first stage of compression, which may reduce data down 10,000 to 1 or so. A second stage reduces it by another 100 to 1 magnitude, which is more of a waveform caching. So after the heartbeat waveform that comes out of the first model, the heart beat waveform is provided to a solver and distilled into specific features. In some example implementations, the waveform shape may be used as the feature, or Fourier Transform frequency peaks may also be used. Other feature or principal component analysis processes may also be use. Any feature distillation that would be relevant to uniquely identifying that waveform may be used and the produced wave form may be compared to determine how close those features resemble a cache of a library of waveforms that we sent or captured in the past.

At 305, a determination is made as to whether the hash is a valid hash or not. If there is a close enough match for all of these features, the process may determine that a hash is basically available at 305 (Yes). If a close enough match against all those features with something in a stored a library of what we have sent in the past, the process 300 will go to box 306 and send the hash and the descriptor of the characteristics sent in the past or basically saving most of the data that we would have normally been sending to the cloud. Thus, the process proceeds to 306 to transmit the hash along with the characteristics of the waveform over a wireless protocol such as LTE.

Conversely, if there is not a close enough match to anything in the library, the new waveform is committed to library and that waveform is sent to the server at 307. In other words, if 305 is no, then the process 300 proceeds to 307 to transmit the raw waveform of the corresponding sliding window.

Through the use of the flow of FIG. 3, event detection can also be facilitated based on the processing of the waveforms in comparison to the hash dictionary. When the detected waveforms do not match with the waveforms in the dictionary, then the waveform may be considered as an event that needs to be reviewed by the operators of the data processing system. Thus, in example implementations, when the raw waveform of the sliding window needs to be transmitted, historical characteristics from previous waveforms, along with the raw waveform information as well as the characteristics of the waveform can be forwarded to the data processing system.

In this manner, raw waveforms do not have to be constantly transmitted to the data processing system, but can be compressed instead based on the corresponding hash. As wireless transmission over protocols such as LTE can be considerably expensive over a long period of time, the compression scheme of FIG. 3 can vastly reduce costs by reducing the data that needs to be transmitted by the energy monitor. Such schemes can also assist in cases where the wireless protocol has limited available bandwidth. Very few existing technologies try to preserve the raw waveforms in this manner.

Further, through this flow, the energy monitor may also omit the waveform hash to save on transmission bandwidth for the next cycle if the waveform has not changed. In example implementations, if the waveform detected in the subsequent window is unchanged from the hash previously sent, the energy monitor can be configured to calculate statistics (e.g., mean, variance, increment values from the previous waveform), and send the statistics to the data processing center instead.

Some related art technologies may attempt to aggregate power like a minutely time stamp. However, these related art technologies are merely distilling one exact date point (e.g., minutely power) that is desired and transmitting. There is not effective caching in these related art technologies.

Example implementations of the present application provide a fundamentally different definition of the data by preserving features that may be needed in the cloud for machine learning. Thus, example implementations may provide a deeper level of data. By providing two stages of compression with different levels of sensitivity, statistical features of the data may be preserved while still attain transmission efficiencies provided by compression.

For example, during the first stage, example implementations may capture a true statistical sample. During this stage, the focus is on drawing a line between boundaries of events and how sensitive the system is to events. In some implementations, a lower level of sensitive may be needed because if an event is missed, the energy is still folded into the next event and there is not a loss of the energy signature. Thus, during this stage a similarity of 3 to 5% may be the threshold. In this stage, on average 10,000 waveform samples may be collapsed into a single cached sample.

During the second stage, a high sensitivity of caching may be used because a wave form will be discarded if it matches the cache. In this situation, the sensitive may be 0.5-1%. There number of wave forms hitting in the cache may be 98% compared to 2% miss across example implementations of systems of the present application.

In additional example implementations, event detection can also be handled when the characteristics (e.g., mean, variance) of the waveform exceed threshold parameters, even if the waveform corresponds to one of the hashes in the dictionary. As the characteristics can be forwarded along with the window, the data processing system can determine whether or not the waveform is within parameters.

Further, each energy monitor may need to undergo a calibration process so that the waveforms can be recorded accurately and matched to the correct waveform hash in the dictionary. As such, memory 101 may also store a calibration offset that is utilized by CPU 100 to provide an offset to the measurements provided by sensor array 102. The calibration offset can be pre-programmed in the memory 101 at manufacture.

In additional example implementations, the memory 102 can be implemented in the form of a Least Recently Used (LRU) cache that keeps and compares waveforms with a linear solver to compress the waveform according to the hash dictionary. In this way, waveforms can be cached and processed with a streaming process in real time.

Figure 4:
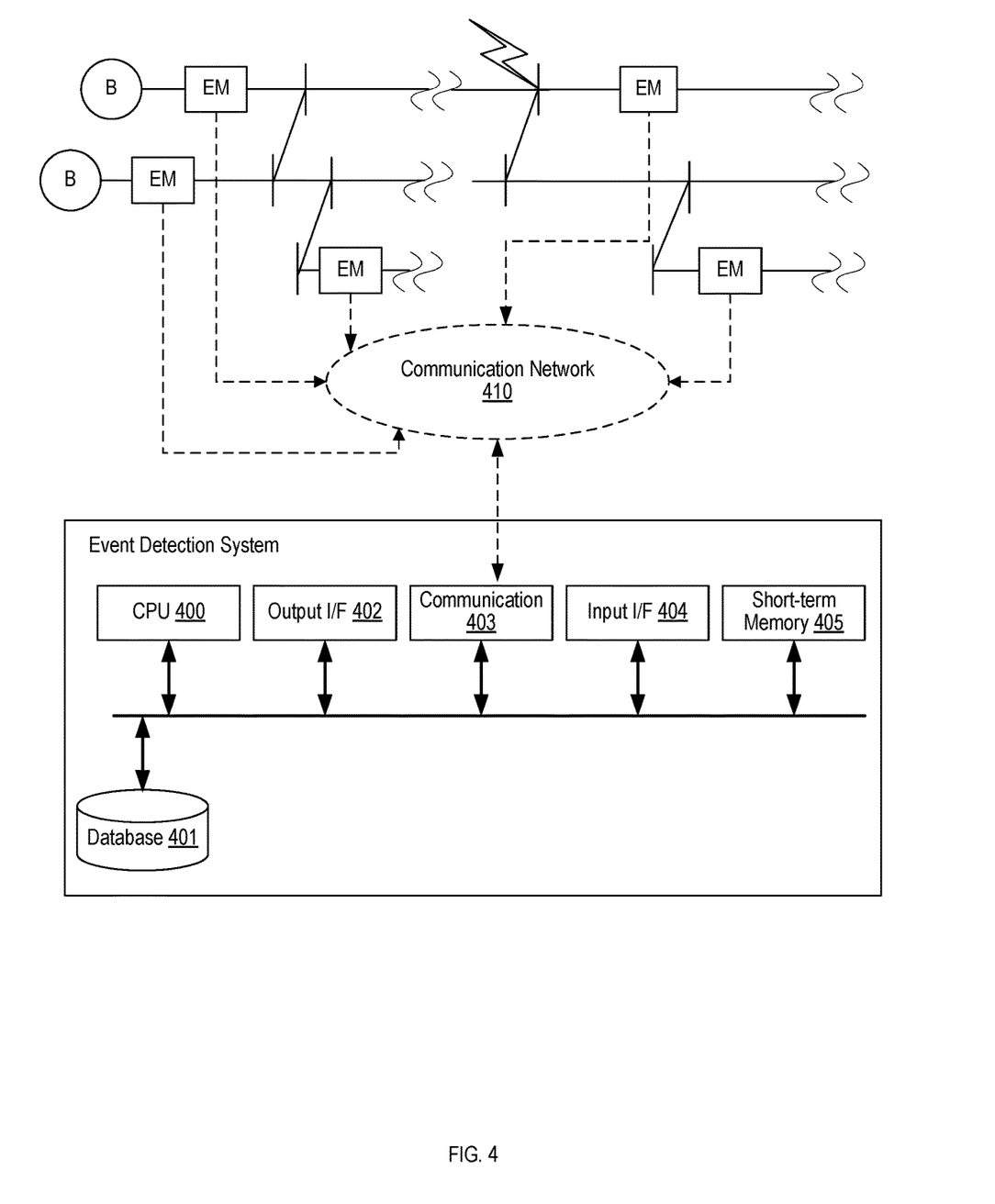
FIG. 4 illustrates an example system upon which example implementations may be applied.

FIG. 4 illustrates an example system upon which example implementations may be applied. The system can include energy monitors applied along the power lines of a building or an area, and electrical buses (designated as B). Event detection system is an apparatus that may be in the form of any system in accordance with a desired implementation (e.g., computer, data center, etc.). The event detection system may be configured to manage a plurality of energy monitors in a power system, and can include a physical central processing unit (CPU) 400, database 401, output interface (I/F) 402, communication processor 403, input I/F 404, and short term memory 405 (e.g. cache). Database 401 may be in the form of one or more storage devices configured to manage data measurements provided by energy monitors. Output I/F 402 provides external output to the operator of the event detection system, such as waveforms, events, and so on. Communication processor 403 can function as an interface for receiving data from the energy monitors through network 410 and conducting initial processing. Input I/F 404 provides interfaces for input from the operator, including keyboards, touchscreens, mouse and so on. Short term memory 405 can function as a cache for temporary storage of data streamed from energy monitors.

In example implementations, the CPU 400 will process measurements from each of the managed energy monitors by receiving a hash of a corresponding waveform and statistics corresponding to the waveform. In this manner, the CPU 400 does not need to receive all of the raw waveforms corresponding to the energy monitors, which can consume wireless bandwidth and become prohibitively expensive. Instead, CPU 400 can receive a waveform hash for a designated period of time, along with waveform statistics (e.g., mean, variance), to determine characteristics of the waveform (e.g., energy monitor detects waveform x over time t with mean of y and variance of +/−z %). Thus, when operating under expected parameters, or when detecting expected waveforms, CPU 400 can received a condensed summary, which allows the energy monitors to transmit over wireless protocols such as LTE.

CPU 400 can be configured to conduct event detection through a statistical comparison of received waveform hashes and statistics to an expected baseline. When the waveform is not within the baseline parameters, then an event can be flagged for the operator.

In some example implementations, some components of the event detection system may be remotely located from other components. Further, some components may be managed by a different entity from other components. For example, a service provider may manage some components, while a customer may manage other components.

Figure 5:
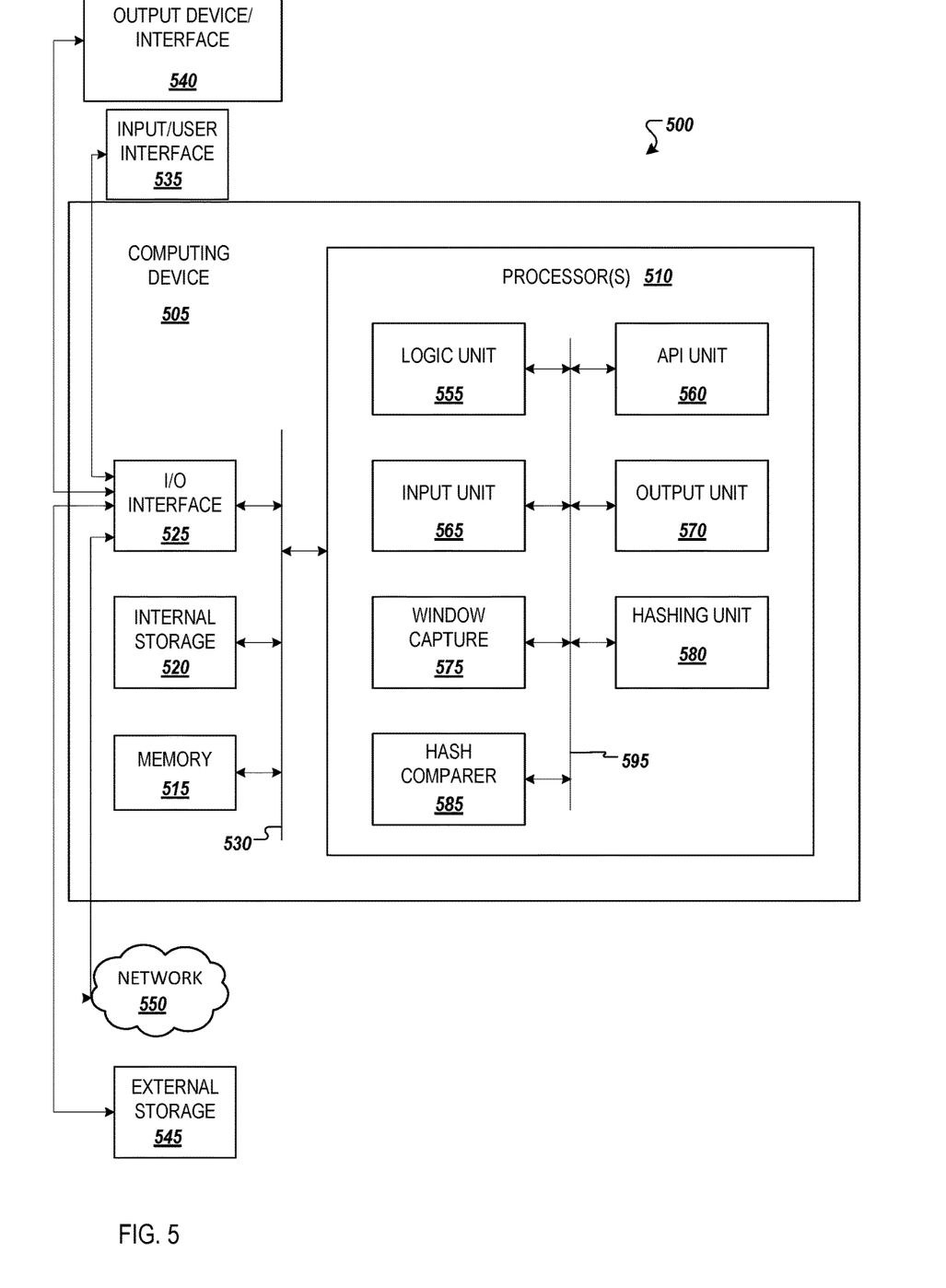
FIG. 5 illustrates an example computing environment with an example computer device suitable for use in some example implementations.

Some portions of the detailed description are presented in terms of algorithms and symbolic representations of operations within a computer. FIG. 5 illustrates an example computing environment 500 with an example computer device 505 suitable for use in some example implementations. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Computing device 505 in computing environment 500 can include one or more processing units, cores, or processors 510, memory 515 (e.g., RAM, ROM, and/or the like), internal storage 520 (e.g., magnetic, optical, solid state storage, and/or organic), and/or I/O interface 525, any of which can be coupled on a communication mechanism or bus 530 for communicating information or embedded in the computing device 505.

Computing device 505 can be communicatively coupled to input/interface 535 and output device/interface 540. Either one or both of input/interface 535 and output device/interface 540 can be a wired or wireless interface and can be detachable. Input/interface 535 may include any device, component, sensor, or interface, physical or virtual, which can be used to provide input (e.g., buttons, touch-screen interface, keyboard, a pointing/cursor control, microphone, camera, braille, motion sensor, optical reader, and/or the like).

Output device/interface 540 may include a display, television, monitor, printer, speaker, braille, or the like. In some example implementations, input/interface 535 (e.g., user interface) and output device/interface 540 can be embedded with, or physically coupled to, the computing device 505. In other example implementations, other computing devices may function as, or provide the functions of, an input/interface 535 and output device/interface 540 for a computing device 505. These elements may include, but are not limited to, well-known AR hardware inputs so as to permit a user to interact with an AR environment.

Examples of computing device 505 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, server devices, other computers, information kiosks, televisions with one or more processors embedded therein and/or coupled thereto, radios, and the like).

Computing device 505 can be communicatively coupled (e.g., via I/O interface 525) to external storage 545 and network 550 for communicating with any number of networked components, devices, and systems, including one or more computing devices of the same or different configuration. Computing device 505 or any connected computing device can be functioning as, providing services of, or referred to as a server, client, thin server, general machine, special-purpose machine, or another label.

I/O interface 525 can include, but is not limited to, wired and/or wireless interfaces using any communication or I/O protocols or standards (e.g., Ethernet, 802.11xs, Universal System Bus, WiMAX, modem, a cellular network protocol, and the like) for communicating information to and/or from at least all the connected components, devices, and network in computing environment 500. Network 550 can be any network or combination of networks (e.g., the Internet, local area network, wide area network, a telephonic network, a cellular network, satellite network, and the like).

Computing device 505 can use and/or communicate using computer-usable or computer-readable media, including transitory media and non-transitory media. Transitory media includes transmission media (e.g., metal cables, fiber optics), signals, carrier waves, and the like. Non-transitory media includes magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computing device 505 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Processor(s) 510 can execute under any operating system (OS) (not shown), in a native or virtual environment. One or more applications can be deployed that include logic unit 555, application programming interface (API) unit 560, input unit 565, output unit 570, window capturing unit 575, hashing unit 580 and hash comparing unit 585, and inter-unit communication mechanism 595 for the different units to communicate with each other, with the OS, and with other applications (not shown).

For example, the window capturing unit 575, the hashing unit 580 and the hash comparing unit 585 may implement one or more processes shown in FIG. 3 and function as part of the systems of FIGS. 1, and 4. The described units and elements can be varied in design, function, configuration, or implementation and are not limited to the descriptions provided.

In some example implementations, when information or an execution instruction is received by API unit 560, it may be communicated to one or more other units (e.g., window capturing unit 575, hashing unit 580 and hash comparing unit 585). For example, the window capturing unit 575 may parse received waveform data into one or more pairs of windows surrounding an event. The pairs of windows may be provided to the hashing unit 580 to generate hashes of each window. Further, the hashes for each window may be provided to the hash comparing unit 585 that compares the generated hashes to hashes of previously encountered events stored in a library of dictionary. Further, the hash comparing unit 585 may also compare the hashes of each window in each pair to each other. Based on the comparisons, the output unit 570 may transmit waveform data and/or hashes over a wireless transmission protocol.

In some instances, the logic unit 555 may be configured to control the information flow among the units and direct the services provided by API unit 560, input unit 565, window capturing unit 575, hashing unit 580 and hash comparing unit 585 in some example implementations described above. For example, the flow of one or more processes or implementations may be controlled by logic unit 555 alone or in conjunction with API unit 560.

Although a few example implementations have been shown and described, these example implementations are provided to convey the subject matter described herein to people who are familiar with this field. It should be understood that the subject matter described herein may be implemented in various forms without being limited to the described example implementations. The subject matter described herein can be practiced without those specifically defined or described matters or with other or different elements or matters not described. It will be appreciated by those familiar with this field that changes may be made in these example implementations without departing from the subject matter described herein as defined in the appended claims and their equivalents.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It can be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application may be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims

The invention claimed is:

1. A method of monitoring power systems over a wireless network protocol, the method comprising:
    receiving input waveform data containing a power event;
    capturing a pair of windows of the waveform data proximate to the power event;
    determining a hash for each of the pairs of window of waveform data;
    comparing each determined hash of each of the pair of windows to a library of hashes of previously encountered events;
    based on the comparison of each determined hash of each pair of windows, transmitting a raw waveform of at least one of the pair windows over the wireless network protocol to an event detection system; and
    conducting event detection through a statistical comparison of received waveform hashes and waveform statistics to baseline parameters to flag the power event when the raw waveform is not within the baseline parameters.

2. The method of claim 1, wherein the transmitting the raw waveform of at least one of the pair windows over the wireless network comprises:
    transmitting the raw waveform over the wireless network protocol in response to a determination that the determined hash is different from every hash in the library of hashes.

3. The method of claim 1, further comprising transmitting a stored hash of a previously encountered event and at least one waveform characteristic of the waveform data of at least one of the pairs of windows in response to a determination that the stored hash of the previously encountered event matches the determined hash of the waveform data of the at least one of the pairs of windows.

4. The method of claim 1, wherein the capturing a pair of windows comprises:
    capturing a first window of waveform data leading up to the event; and
    capturing a second window of waveform data leading up to the event.

5. The method of claim 1, wherein the power event is detected based on a statistical change in the waveform data.

6. The method of claim 1, wherein the capturing the pair of windows of the waveform data proximate to the power event comprises detecting a statistical characteristic of the waveform data in each of the pair of windows.

7. The method of claim 1, wherein the capturing the pair of windows of the waveform data proximate to the power event comprises generating a folded statistical sample of all waveforms captured during each pair of windows, each folded statistical sample providing a "heartbeat" signal representative of the waveform data of each window of the pair of windows.

8. The method of claim 1, further comprising comparing the determined hash of one of the pair of windows to the determined hash of the other of the pair of windows and calculating waveform statistics based on the comparison of the determined hash of one of the pair of windows to the determined hash of an other of the pair of windows.

9. The method of claim 8, further comprising transmitting the calculated waveform statistics over the wireless network protocol to an event detection system based on the comparison of the determined hash of one of the pair of windows to the determined hash of the other of the pair of windows.

10. The method of claim 8, further comprising determining to not transmit the waveform has of either window of the pair of windows based on a determination that the determined hash of the one of the pair of windows has not changed from the determined hash of the other of the pair of windows.

11. An energy monitor system, comprising:
    a sensor array coupled to a power system; and
    a processor, configured to:
    receive input waveform data containing a power event from the sensor array;
    capture a pair of windows of the waveform data proximate to the power event;
    determine a hash for each of the pairs of window of waveform data;
    compare each determined hash of each of the pair of windows to a library of hashes of previously encountered events;
    based on the comparison of each determined hash of each pair of windows, transmit a raw waveform of at least one of the pair windows over a wireless network protocol to an event detection system; and
    conduct event detection through a statistical comparison of received waveform hashes and waveform statistics to baseline parameters to flag the power event when the raw waveform is not within the baseline parameters.

12. The system of claim 11, wherein the transmitting the raw waveform of at least one of the pair windows over the wireless network comprises:
    transmitting the raw waveform over the wireless network protocol in response to a determination that the determined hash is different from every hash in the library of hashes.

13. The system of claim 12, further comprising transmitting a stored hash of a previously encountered event and at least one waveform characteristic of the waveform data of at least one of the pairs of windows in response to a determination that the stored hash of the previously encountered event matches the determined hash of the waveform data of the at least one of the pairs of windows.

14. The system of claim 13, wherein the capturing a pair of windows comprises:
    capturing a first window of waveform data leading up to the event; and
    capturing a second window of waveform data leading up to the event.

15. The system of claim 14, wherein the power event is detected based on a statistical change in the waveform data.

16. The system of claim 15, wherein the capturing the pair of windows of the waveform data proximate to the power event comprises detecting a statistical characteristic of the waveform data in each of the pair of windows.

17. The system of claim 16, wherein the capturing the pair of windows of the waveform data proximate to the power event comprises generating a folded statistical sample of all waveforms captured during each pair of windows, each folded statistical sample providing a "heartbeat" signal representative of the waveform data of each window of the pair of windows.

18. The system of claim 17, further comprising comparing the determined hash of one of the pair of windows to the determined hash of the other of the pair of windows and calculating waveform statistics based on the comparison of the determined hash of one of the pair of windows to the determined hash of an other of the pair of windows.

19. The system of claim 18, further comprising transmitting the calculated waveform statistics over the wireless network protocol to an event detection system based on the comparison of the determined hash of one of the pair of windows to the determined hash of the other of the pair of windows.

20. The system of claim 19, further comprising determining to not transmit the waveform has of either window of the pair of windows based on a determination that the determined hash of the one of the pair of windows has not changed from the determined hash of the other of the pair of windows.

* * * * *